(12) United States Patent
Sterzel et al.

(10) Patent No.: US 6,744,110 B2
(45) Date of Patent: Jun. 1, 2004

(54) THERMOELECTRICALLY ACTIVE MATERIALS AND GENERATORS AND PELTIER ARRANGEMENTS CONTAINING THEM

(75) Inventors: Hans-Josef Sterzel, Dannstadt-Schauernheim (DE); Klaus Kühling, Mutterstadt (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 10/227,792

(22) Filed: Aug. 27, 2002

(65) Prior Publication Data

US 2003/0057512 A1 Mar. 27, 2003

(30) Foreign Application Priority Data

Aug. 31, 2001 (DE) .......................... 101 42 634

(51) Int. Cl.[7] ............................................. H01L 31/058

(52) U.S. Cl. ....................................... 257/467; 136/205

(58) Field of Search ........................... 136/205; 257/467

(56) References Cited

U.S. PATENT DOCUMENTS

| | | | | |
|---|---|---|---|---|
| 5,448,109 | A | 9/1995 | Cauchy | 257/719 |
| 6,225,550 | B1 | 5/2001 | Hornbostel et al. | 136/236.1 |
| 6,399,871 | B1 * | 6/2002 | Sharp | 136/201 |
| 6,444,894 | B1 * | 9/2002 | Sterzel | 136/205 |
| 6,468,806 | B1 * | 10/2002 | McFarland et al. | 436/518 |

FOREIGN PATENT DOCUMENTS

EP 1 102 334 5/2001 ........... H01L/35/16

* cited by examiner

*Primary Examiner*—Allan R. Wilson
(74) *Attorney, Agent, or Firm*—Keil & Weinkauf

(57) ABSTRACT

In a thermoelectric generator or Peltier arrangement having a thermoelectrically active semiconductor material constituted by a plurality of metals or metal oxides the thermoelectrically active material is selected from a p- or n-doped semiconductor material constituted by a ternary compound of the general formula (I)

$$Me_x S^A_y S^B_z \qquad (I)$$

with

Me=Al, Ti, Zr, V, Nb, Ta, Cr, Mo, W, Mn, Fe, Co, Ni, Cu or Ag, $S^A$, $S^B$=B, C, Si, Ge, Sb, Se or Te, where $S^A$ and $S^B$ respectively come from different groups of the periodic table, x, y, z independently of one another have values from 0.01 to 1, and where the proportion by weight of $S^A$ and $S^B$ together is no more than 30%, expressed in terms of the total semiconductor material, except for ternary compounds constituted by $AlB_{12}$ and $SiB_6$, or a mixed oxide of the general formula (II)

$$[(CaO)_u \cdot (SrO)_v \cdot (BaO)_w \cdot (1/2Bi_2O_3)_x]_f \cdot \frac{2n+a}{2} \cdot \left( \{k\}Me^n O_{\frac{n}{2}} \cdot \{2-k\}Me^{n+a} O_{\frac{n+a}{2}} \right) \qquad (II)$$

with

Me=Fe, Cu, V, Mn, Sn, Ti, Mo, W n=integer from 1 to 6, a=1 or 2, f=number from 0.2 to 5, k=number from 0,01 to 2, u+v+w+x=1.

8 Claims, No Drawings

THERMOELECTRICALLY ACTIVE MATERIALS AND GENERATORS AND PELTIER ARRANGEMENTS CONTAINING THEM

The invention relates to thermoelectrically active materials, as well as to generators and Peltier arrangements containing them.

Thermoelectric generators per se have been known for a long time. p- or n-doped semiconductors, which are heated on one side and are cooled on the other side, transport electrical charges through an external circuit, with electrical work being done at a load in the circuit. The efficiency achieved in this case for the conversion of heat into electrical energy is limited thermodynamically by the Carnot efficiency. For instance, with a temperature of 1000 K on the hot side and 400 K on the "cold" side, an efficiency of (1000–400): 1000=60% would be possible. Unfortunately, efficiencies of only up to 10% have been achieved to date.

On the other hand, if a direct current is applied to such an arrangement, then heat will be transported from one side to the other. Such a Peltier arrangement works as a heat pump and is therefore suitable for the cooling of equipment parts, vehicles or buildings. Heating by means of the Peltier principle is also more favorable than conventional heating, because the quantity of heat transported is always greater than corresponds to the energy equivalent which is supplied.

A good review of effects and materials is given e.g. by Cronin B. Vining, ITS Short Course on Thermoelectricity, Nov. 8, 1993, Yokahama, Japan.

Thermoelectric generators are currently used in space probes for the generation of direct currents, for the cathodic corrosion protection of pipelines, for the energy supply of lighted and radio buoys, and for the operation of radios and television sets. The advantages of thermoelectric generators are that they are extremely reliable, they work irrespective of atmospheric conditions such as humidity, and no material transport susceptible to disruption takes place, instead only charge transport; the fuel is burned continuously—and catalytically without a free flame—so that minor amounts of CO, $NO_x$ and unburned fuel are released; it is possible to use any fuels from water through natural gas, gasoline, kerosene and diesel to biologically produced fuels such as rapeseed oil methyl ester.

Thermoelectric energy conversion therefore fits in extremely flexibly with future requirements such as hydrogen economy or energy production from regenerative energies.

An especially attractive application could involve use for conversion into electrical energy in electrically powered vehicles. No modification to the existing network of the fuelling stations would need to be carried out. For such an application, however, efficiencies in excess of 30% would be necessary.

The conversion of solar energy directly into electrical energy could also be very attractive. Concentrators such as parabolic collectors can focus the sun's energy with efficiencies of 95–97% onto thermoelectric generators, so that electrical energy can be produced.

Higher efficiencies, however, are necessary for use as a heat pump.

It is an object of the present invention to provide thermoelectric active materials which permit higher efficiencies than previously. A characteristic of thermoelectric materials is the so-called Z factor (figure of merit)

$$Z = \frac{\alpha^2 * \sigma}{K}$$

with $\alpha$ being the Seebeck coefficient, $\sigma$ being the electrical conductivity and K being the thermal conductivity.

A more accurate analysis is the efficiency as $\eta$ $$\eta = \frac{T_{high} - T_{low}}{T_{high}} * \frac{M - 1}{M + \frac{T_{high}}{T_{low}}}$$

with $M=[1+z/2(T_{high}-T_{low})]1/2$
(cf. Mat Sci. and Eng. B29 (1995) 228).

The aim is therefore to provide a material having a maximally high value for Z and high achievable temperature difference. In terms of solid-state physics, many problems need to be overcome in this case:

A high $\alpha$ entails high electron mobility in the material; i.e. electrons (or holes in the case of p-conducting materials) must not be strongly bound to the atom rumps. Materials having a high electrical conductivity usually also have a high thermal conductivity (Wiedemann-Franz law), so that Z cannot be favorably influenced. Currently used materials such as $Bi_2Te_3$, PbTe or SiGe indeed represent compromises. For instance, the electrical conductivity is reduced less than the thermal conductivity by alloying. It is therefore preferable to use alloys such as e.g.$(Bi_2Te_3)_{90}(Sb_2Te_3)_5(Sb_2Se_3)_5$ or $Bi_{12}Sb_{23}Te_{65}$, as are described in U.S. Pat. No. 5,448,109.

For thermoelectric materials with high efficiency, it is also preferable to satisfy further constraints. Above all, they must be thermally stable so that they can work for years without substantial loss of efficiency at working temperatures of 1000 to 1500 K. This entails phases which per se are stable at high temperatures, a stable phase composition, as well as negligible diffusion of alloy constituents into the adjoining contact materials.

The recent patent literature contains descriptions of thermoelectric materials, for example U.S. Pat. No. 6,225,550 and EP-A-1 102 334. U.S. Pat. No. 6,225,550 relates essentially to materials constituted by $Mg_xSb_z$, which are additionally doped with a further element, preferably a transition metal.

EP-A-1 102 334 discloses p- or n-doped semiconductor materials which represent an at least ternary material constituted by the material classes: silicides, borides, germanides, tellurides, sulfides and selenides, antimonides, plumbides and semiconducting oxides.

There is nevertheless still a need for thermoelectrically active materials which have a high efficiency and exhibit a suitable property profile for different application fields. Research in the field of thermoelectrically active materials can by no means yet be regarded as concluded, so that there is still a demand for different thermoelectric materials.

We have found that this object is achieved by a thermoelectric generator or a Peltier arrangement having a thermoelectrically active semiconductor material constituted by a plurality of metals or metal oxides, wherein the thermoelectrically active material is selected from a p- or n-doped semiconductor material constituted by a ternary compound of the general formula (I)

with
Me=Al, Ti, Zr, V, Nb, Ta, Cr, Mo, W, Mn, Fe, Co, Ni, Cu or Ag,
$S^A, S^B$=B, C, Si, Ge, Sb, Se or Te,
where $S^A$ and $S^B$ respectively come from different groups of the periodic table, x, y, z independently of one another have values from 0.01 to 1, and where the proportion by weight of $S^A$ and $S^B$ together is no more than 30%, expressed in terms of the total semiconductor material, except for ternary compounds constituted by $AlB_{12}$ and $SiB_6$, or a mixed oxide of the general formula (II)

$$[(CaO)_u \cdot (SrO)_v \cdot (BaO)_w \cdot (1/2Bi_2O_3)_x]_f \cdot \quad \text{(II)}$$

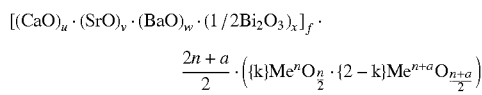

with

Me=Fe, Cu, V, Mn, Sn, Ti, Mo, W
n=integer from 1 to 6,
a=1 or 2,
f=number from 0.2 to 5,
k=number from 0.01 to 2, preferably 0.01 to 1.99, e.g. 1
u+v+w+x=1.

The thermoelectric generators and Peltier arrangements according to the invention enhance quite generally, on the one hand, the range of available thermoelectric generators and Peltier arrangements. Owing to the different chemical systems, it is possible to satisfy different requirements in various application fields of the thermoelectric generator or Peltier arrangements. The thermoelectric generators and Peltier arrangements according to the invention hence significantly extend the possibilities for application of these elements under different conditions.

Preferred semiconductor materials will be explained in more detail below.

In the ternary compounds of the general formula (I), $S^A$ and $S^B$ are preferably selected from B, C, Ge, Sb and Te.

In this semiconductor material, Me is preferably selected from one of the following groups:

1) Al, Ti, Zr.
2) V, Nb, Ta
3) Cr, Mo, W
4) Mn, Fe, Co, Ni
5) Cu, Ag.

The proportion of doping elements is up to 0.1 atom % in the alloy, or from $10^{18}$ to $10^{20}$ charge carriers per cubic centimeter. Higher charge-carrier concentrations cause disadvantageous recombinations, and hence a reduced charge mobility. The doping is carried out with elements which cause an electron surplus or deficit in the crystal lattice, e.g. with iodide for n-type semiconductors and alkaline-earth elements for p-type semiconductors, so long as a 3/5 or 3/6 semiconductor is present.

A further possible way of doping is obtained if holes or electrons are deliberately introduced into the materials by means of super- or sub-stoichiometric compositions, which obviates the need for an additional doping step.

Dopant elements may also, however, be introduced via aqueous solutions of metal salts, which are subsequently dried in the mixture. The metal cations are then reduced e.g. by hydrogen at elevated temperatures or remain in the material without reduction. Preferably, the p- or n-doping is carried out through selection of the quantitative proportions of the compounds, or the p-doping is carried with alkali metals and the n-doping with Sb, Bi, Se, Te, Br or I (see WO 92/13811).

The materials according to the invention of the general formula (I) are prepared by known methods, the element compounds e.g. by sintering the element powders at high temperatures, but below the melting point, under an inert gas such as argon or in a vacuum, or by melting in a high vacuum and subsequently powdering and sintering or by melting the mixture of element powders and cooling.

In the mixed oxides of the general formula (II), n denotes the oxidation state of the metal Me and f denotes a stoichiometric factor. f has a value in the range from 0.2 to 5, preferably 0.5 to 2, particularly preferably 1. a indicates the difference between the two different oxidation states of Me.

For the stoichiometric factor f, numbers from 0.2 to 0.99, the value 1, numbers from 1.01 to 2 and numbers from 2.01 to 5 may be indicated as preferred ranges. Each of these cases involves a preferred embodiment of the invention.

The expression in brackets

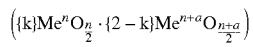

may preferably be, specifically:

$FeO//Fe_2O_3$
$Cu_2O//CuO$
$VO//V_2O_3$
$V_2O_3//V_2O_5$
$VO_2//V_2O_5$
$VO_2//V_2O_3$
$MnO//Mn_2O_3$
$Mn_2O_3//Mn_2O_3$
$SnO//SnO_2$
$TiO//Ti_2O_3$
$Ti_2O_3//TiO_2$
$MoO_2//MoO_3$ or
$WO_2//WO_3$, especially preferably, specifically
$FeO.1/2Fe_2O_3$
$1/2Cu_2O.CuO$
$VO.1/2V_2O_3$
$V_2O_3.V_2O_5$
$VO_2.1/2V_2O_5$
$VO_2.1/2V_2O_3$
$MnO.1/2Mn_2O_3$
$1/2Mn_2O_3.1/2Mn_2O_3$
$SnO.SnO_2$
$TiO.1/2Ti_2O_3$
$1/2Ti_2O_3.TiO_2$
$MoO_2.MoO_3$ or
$WO_2.WO_3$ The mixed oxides according to the invention are prepared using known methods, preferably by intimate mixing of the individual oxides by known ceramic technologies, pressing the mixtures under pressure to form moldings of, for example, cuboid configuration, or mixing in slurries of the individual oxides and pouring the slurries into appropriate molds, subsequently removing the suspension medium and sintering the moldings in an inert atmosphere, e.g. under argon, at temperatures from 900 to 1700° C.

The materials according to the invention are hence prepared by known methods, the element compounds e.g. by sintering the element powders at high temperatures, but below the melting point, or by melting in a high vacuum and subsequent powdering and sintering. The oxides are synthesized e.g. by sintering the powder mixtures of the individual oxides. The expression "combinatorial", as used here, refers specifically to this preparation, in particular the sintering.

The thermoelectrically active mixed oxides can also be prepared by reactive sintering of the corresponding metal mixtures in air at elevated temperatures. For economic reasons, it is also expedient to use mixtures of oxides and metals.

It is also an object of the invention to optimize the materials in terms of efficiency. It is obvious that, when the components are varied by, for example, 5 atom %, very many materials need to be synthesized and tested. We have found that this object is achieved by combinatorial methods. To that end, element alloys or oxide mixtures or mixtures of elements with oxides, with gradual variation of the composition as a function of the length coordination on a substrate, can be produced by producing the elements or already binary alloys, from appropriate targets, on a substrate provided with a perforated mask, the element composition changing as a function of the distance from the target or as a function of the sputtering angle. The mask is subsequently removed, and the "dots" which are produced are sintered to form the actual materials. The expression "dot" refers in this case to points or regions of the material which are spatially separated from one another on a substrate, which have essentially the same extents and which are preferably arranged at regular intervals, so that an array is obtained. "Array" means a two-dimensional, essentially uniformly spaced arrangement of dots on a substrate surface. It is also possible to suspend element and oxide powders having particle sizes smaller than 5 $\mu$m in an inert suspension medium, such as hydrocarbons, with the participation of a dispersing agent to form sufficiently stable suspensions, and to deposit mixtures of the suspensions as droplets, in the manner described for the oxides, to evaporate the suspension medium and to sinter on the substrate the powder mixtures formed in this way.

Besides metallic substrates, silicon carbide, which is also sufficiently electrically conductive, is preferred as an inert substrate material which is stable with respect to temperature and diffusion.

Dots of the oxides can be produced on a substrate surface by using doping machines to deposit mixtures of salts, preferably nitrates or other soluble compounds, in the form of drops with variable composition, evaporating the solvent, preferably water, converting the nitrates or compounds into the oxides by raising the temperature and subsequently sintering the oxide mixtures in their entirety.

Per substrate plate with dimensions of the order of 10*10 cm, from 1000 to 10,000 dots with size (diameters) of from 0.2 to 2 mm are applied.

It may also be favorable to introduce the element or oxide mixtures as a suspension into a plate having angular cavities, to extract the suspension medium under reduced pressure, to melt or sinter the material and then to test the small cubes or blocks hence obtained. The cavities may also be cuboid with dimensions in the millimeter range. For example, cuboid cavities with the dimensions 6×5×9 mm may be used.

One advantage of this procedure is that the size proportions are preserved in the finished generator or Peltier module. Such a plate may, for example, contain from 20 to 100 cavities.

Fast and reliable testing of the materials is essential. According to the invention, two analysis methods may be implemented for this purpose:

The invention relates to a process for the combinatorial preparation and testing of semiconductor materials for thermoelectric generators, in which an array of dots of the semiconductor materials with different composition is produced on a conductive two-dimensional substrate, the substrate is heat-treated, preferably under an inert gas such as nitrogen or argon, with the array to a desired measurement temperature and the dots are respectively brought into contact with a cooled measurement pin, the voltage without load, the current and the voltage with a decreasing load resistance and/or the short-circuit current being measured, subsequently stored and evaluated. Since the material and specimens are automatically at the temperature of the substrate plate, it is only when the cooled measurement pin is applied that a temperature gradient which grows within seconds is produced, which generates a short-circuit current varying as a function of temperature, which is measured and whose profile is stored. The invention also relates to a process for the combinatorial preparation and testing of semiconductor materials for thermoelectric generators, in which an array of dots of the semiconductor materials with different composition is produced on a conductive two-dimensional substrate, the dots are brought into contact on the opposite side from the substrate with a conductive non-magnetic plate, the substrate and the plate are kept at different temperatures and are electrically connected to one another, the plate being scanned with a magnetic-field probe and the measured data being stored and evaluated.

For both methods, the dots situated on the metallic or silicon-carbide substrate are ground to a uniform height e.g. by using a microfine grinding disk, a plane surface with a small roughness depth being obtained at the same time. The substrate plate is brought to a measurement temperature, and the dots are brought into contact with a cooled measurement pin under a defined application force.

Conversely, it is also possible to leave the substrate plate cold and to heat the measurement pin. In this case, the heating should not be carried out electrically, but rather, in order to prevent the incorporation of spurious currents, purely thermally, for example by focusing an infrared laser suitably onto the measurement pin.

While the measurement pin is being applied, the voltage without load, the current and the voltage with a decreasing load resistance as well as the short-circuit current are measured. Computer-controlled measurement equipment requires about 10 seconds in order to measure one material, including travel to the next dot, which makes it possible to measure approximately 10,000 dots per day at one temperature. If operation is carried out with a plurality of measurement pins in parallel, then a correspondingly larger number of dots can be measured. The measured values and curves can be stored and graphically processed, so that a graphical representation indicates, at a glance, the better materials whose composition is then analyzed using standard methods. Operation is preferably carried out under an inert gas.

A further, but contactless testing/evaluation method consists in applying a further conductive non-magnetic cooled plate to the dots, which are situated on the conductive/metallic substrate plate, and in electrically connecting the two plates to one another. At the applied temperature difference, each dot is short-circuited. The short-circuit current generates local magnetic fields in the dots and in the surrounding parts of the plate. The plate is scanned with a magnetic-field probe—e.g. a Hall probe or a squid—and the measurement values are stored in a computer as a function of the coordinates. The strength of the magnetic field is proportional to the short-circuit current, and its direction indicates whether the material is p- or n-conducting. Appropriate graphical processing of the measured values shows the particularly advantageous dots at a glance.

With this method, 10,000 dots can be measured within 5 to 30 min., but only with respect to doping and the short-circuit current.

The invention also relates to an array of at least 10 different semiconductor materials according to the invention on a conductive substrate.

The materials according to the invention are introduced into modules, as described e.g. in WO 98/44562, U.S. Pat. No. 5,448,109, EP-A-1 102 334 or U.S. Pat. No. 5,439,528, and these modules are connected in series.

We claim:

1. A thermoelectric generator or Peltier arrangement having a thermoelectrically active semiconductor material constituted by a plurality of metals or metal oxides, wherein the thermoelectrically active material is selected from a p- or n-doped semiconductor material constituted by a mixed oxide of formula (II)

$$[(CaO)_u \cdot (SrO)_v \cdot (BaO)_w \cdot (1/2Bi_2O_3)_x]_f \cdot \quad \text{(II)}$$

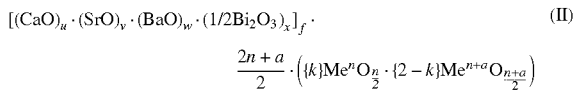

with

Me=Fe, Cu, V, Mn, Sn, Ti, Mo, W, n=integer from 1 to 6, a=1 or 2, f=number from 0.2 to 5, k=number from 0.01 to 2, u+v+w+x=1.

2. A thermoelectric generator or Peltier arrangement as claimed in claim 1, wherein f is 1, or f has a value in the range from 0.2 to 0.9, or in the range from 1.01 to 2, or in the range from 2.01 to 5.

3. A semiconductor material constituted by a plurality of metals or metal oxides, wherein the thermoelectrically active material is selected from a p- or n-doped semiconductor material constituted by a mixed oxide of formula (II)

$$[(CaO)_u \cdot (SrO)_v \cdot (BaO)_w \cdot (1/2Bi_2O_3)_x]_f \cdot \quad \text{(II)}$$

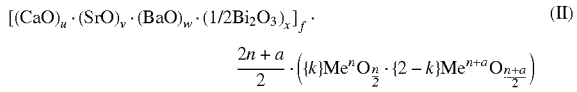

with

Me=Fe, Cu, V, Mn, Sn, Ti, Mo, W, n=integer from 1 to 6, a=1 or 2, f=number from 0.2 to 5, k=number from 0.01 to 2, u+v+w+x=1.

4. An array of at least 10 different semiconductor materials as claimed in claim 3 on a conductive substrate.

5. The thermoelectric generator or Peltier arrangement defined in claim 1, wherein

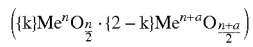

denotes a combination of Me oxides selected from the group consisting of a combination of FeO and $Fe_2O_3$, a combination of $Cu_2O$ and CuO, a combination of VO and $V_2O_5$, a combination of $V_2O_3$ and $V_2O_5$, a combination of $VO_2$ and $V_2O_5$, a combination of $VO_2$ and $V_2O_3$, a combination of MnO and $Mn_2O_3$, a combination of SnO and $SnO_2$, a combination of TiO and $Ti_2O_3$, a combination of $Ti_2O_3$ and $TiO_2$, a combination of $MoO_2$ and $MoO_3$, and a combination of $WO_2$ and $WO_3$.

6. The thermoelectric generator or Peltier arrangement defined in claim 5, wherein the combination of Me oxides is selected from the group consisting of $FeO.1/2Fe_2O_3$, $1/2Cu_2O.CuO$, $VO.1/2V_2O_3$, $V_2O_3.V_2O_5$, $VO_2.1/2V_2O_3$, $MnO.1/2Mn_2O_3$, $SnO.SnO_2$, $TiO.1/2Ti_2O_3$, $1/2Ti_2O_3.TiO_2$, $MoO_2.MoO_3$ and $WO_2.WO_3$.

7. The semiconductor material defined in claim 3, wherein

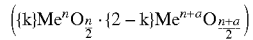

denotes a combination of Me oxides selected from the group consisting of a combination of FeO and $Fe_2O_3$, a combination of $Cu_2O$ and CuO, a combination of VO and $V_2O_5$, a combination of $V_2O_3$ and $V_2O_5$, a combination of $VO_2$ and $V_2O_5$, a combination of $VO_2$ and $V_2O_3$, a combination of MnO and $Mn_2O_3$, a combination of SnO and $SnO_2$, a combination of TiO and $Ti_2O_3$, a combination of $Ti_2O_3$ and $TiO_2$, a combination of $MoO_2$ and $MoO_3$, and a combination of $WO_2$ and $WO_3$.

8. The semiconductor material defined in claim 7, wherein the combination of Me oxides is selected from the group consisting of $FeO.1/2Fe_2O_3$, $1/2Cu_2O.CuO$, $VO.1/2V_2O_3$, $V_2O_3.V_2O_5$, $VO_2.1/2V_2O_3$, $MnO.1/2Mn_2O_3$, $SnO.SnO_2$, $TiO.1/2Ti_2O_3$, $1/2Ti_2O_3.TiO_2$, $MoO_2.MoO_3$ and $WO_2.WO_3$.

* * * * *